United States Patent
Pant et al.

(10) Patent No.: US 9,762,234 B2
(45) Date of Patent: Sep. 12, 2017

(54) INPUT DEVICE INTERFERENCE DETERMINATION

(75) Inventors: Vivek Pant, San Jose, CA (US); Farzaneh Shahrokhi, San Jose, CA (US); Shahrooz Shahparnia, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 706 days.

(21) Appl. No.: 13/024,539

(22) Filed: Feb. 10, 2011

(65) Prior Publication Data

US 2012/0206154 A1 Aug. 16, 2012

(51) Int. Cl.
G01R 29/26 (2006.01)
H03K 17/96 (2006.01)
G06F 3/041 (2006.01)
G06F 3/044 (2006.01)

(52) U.S. Cl.
CPC ......... H03K 17/962 (2013.01); G06F 3/044 (2013.01); G06F 3/0416 (2013.01); *H03K 2217/94026* (2013.01); *H03K 2217/96071* (2013.01)

(58) Field of Classification Search
CPC ..... G06F 3/0416; G06F 3/044; H03K 17/962; H03K 2217/94026; H03K 2217/96071; G01R 25/00; G01R 29/26
USPC ........ 73/304 C; 324/650–690; 327/336–342; 327/514; 340/522, 531, 690; 361/284
See application file for complete search history.

(56) References Cited

U.S. PATENT DOCUMENTS

| | | | |
|---|---|---|---|
| 5,255,227 A * | 10/1993 | Haeffele | 365/200 |
| 5,659,254 A | 8/1997 | Matsumoto et al. | |
| 7,271,660 B1 | 9/2007 | Carroll | |
| 7,277,264 B2 | 10/2007 | Kitagawa | |
| 7,358,819 B2 | 4/2008 | Rollins | |
| 7,834,697 B1 | 11/2010 | Lipka | |
| 8,258,797 B2 * | 9/2012 | Shahparnia et al. | 324/659 |
| 2003/0011378 A1 | 1/2003 | Ishio et al. | |
| 2003/0016849 A1 | 1/2003 | Andrade | |
| 2005/0213275 A1 * | 9/2005 | Kitagawa | 361/93.1 |

(Continued)

OTHER PUBLICATIONS

ISA/KR, International Search Report and Written Opinion for International Application No. PCT/US2010/034573, 8 pages, Dec. 29, 2010 (Dec. 29, 2010).

(Continued)

*Primary Examiner* — Son Le
*Assistant Examiner* — Brent J Andrews
(74) *Attorney, Agent, or Firm* — Osha Liang LLP

(57) ABSTRACT

An interference determining circuit for a capacitive sensor device comprises an amplifier, absolute differential circuitry, and comparator circuitry. The amplifier is configured for receiving a reference voltage at a first input and for receiving a resulting signal at a second input. The resulting signal is from a sensor electrode of the capacitive sensor device. The absolute differential circuitry is coupled with an output of the amplifier and configured for outputting a difference signal. The difference signal represents an absolute differential between currents utilized in the amplifier. The comparator circuitry is coupled with the absolute differential circuitry and configured for generating a non-linearity indication based on a comparison of the difference signal with at least one reference signal.

20 Claims, 9 Drawing Sheets

(56) References Cited

U.S. PATENT DOCUMENTS

2007/0164825 A1* 7/2007 Rollins .................... H03F 1/34
 330/308
2007/0247171 A1* 10/2007 O'Dowd et al. .............. 324/658
2010/0327882 A1* 12/2010 Shahparnia et al. .......... 324/659
2012/0293190 A1* 11/2012 Shahparnia et al. .......... 324/659

OTHER PUBLICATIONS

Office Action, U.S. Appl. No. 13/562,207, mailed Apr. 16, 2015, 11 pages.

\* cited by examiner

600

```
┌─────────────────────────────────────────────────────────┐
│ MEASURE A RESULTING SIGNAL RECEIVED FROM A RECEIVER     │
│ ELECTRODE OF A CAPACITIVE SENSOR DEVICE, WHEREIN THE    │
│ MEASURING IS PERFORMED WITH AN AMPLIFIER.               │
│ 610                                                     │
└─────────────────────────────────────────────────────────┘
                            │
                            ▼
┌─────────────────────────────────────────────────────────┐
│ DETERMINE A DIFFERENCE SIGNAL, WHEREIN THE DIFFERENCE   │
│ SIGNAL REPRESENTS AN ABSOLUTE DIFFERENTIAL BETWEEN      │
│ CURRENTS UTILIZED IN THE AMPLIFIER DURING THE MEASURING.│
│ 620                                                     │
└─────────────────────────────────────────────────────────┘
                            │
                            ▼
┌─────────────────────────────────────────────────────────┐
│ GENERATE A NON-LINEARITY INDICATION BASED UPON A        │
│ COMPARISON OF THE DIFFERENCE SIGNAL WITH AT LEAST ONE   │
│ REFERENCE SIGNAL.                                       │
│ 630                                                     │
└─────────────────────────────────────────────────────────┘
```

INPUT DEVICE INTERFERENCE DETERMINATION

BACKGROUND

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

SUMMARY

An interference determining circuit for a capacitive sensor device comprises an amplifier, absolute differential circuitry, and comparator circuitry. The amplifier is configured for receiving a reference voltage at a first input and for receiving a resulting signal at a second input. The resulting signal is from a sensor electrode of the capacitive sensor device. The absolute differential circuitry is coupled with an output of the amplifier and configured for outputting a difference signal. The difference signal represents an absolute differential between currents utilized in the amplifier. The comparator circuitry is coupled with the absolute differential circuitry and configured for generating a non-linearity indication based on a comparison of the difference signal with at least one reference signal.

BRIEF DESCRIPTION OF DRAWINGS

The drawings referred to in this Brief Description of Drawings should not be understood as being drawn to scale unless specifically noted. The accompanying drawings, which are incorporated in and form a part of the Description of Embodiments, illustrate various embodiments of the present invention and, together with the Description of Embodiments, serve to explain principles discussed below, where like designations denote like elements, and:

FIGS. 6A and 6B show a flow diagram of an example method of interference determination in a capacitive sensor device, in accordance with various embodiments.

DESCRIPTION OF EMBODIMENTS

The following Description of Embodiments is merely provided by way of example and not of limitation. Furthermore, there is no intention to be bound by any expressed or implied theory presented in the preceding background or brief summary, or in the following detailed description.

Overview of Discussion

Herein, various embodiments are described that provide input devices and methods that facilitate improved usability. In various embodiments described herein, the input device may be a capacitive sensing device.

Discussion begins with a description of an example input device with which or upon which various embodiments described herein may be implemented. An example processing system and components thereof are then described. The processing system may be utilized with an input device, such as a capacitive sensing device, or with some other device/system. Example embodiments of absolute differential circuitry and current comparator circuits are described. Operation of the processing system and its components, the absolute differential circuitry, and the current comparator circuits are further described in conjunction with description of an example method of interference determination in a capacitive sensor device. As will be seen the presence of interference to an amplifier and a capacitive touch sensing device can be determined based upon an amplifier operating in a non-linear fashion.

Example Input Device

Figure 1A:
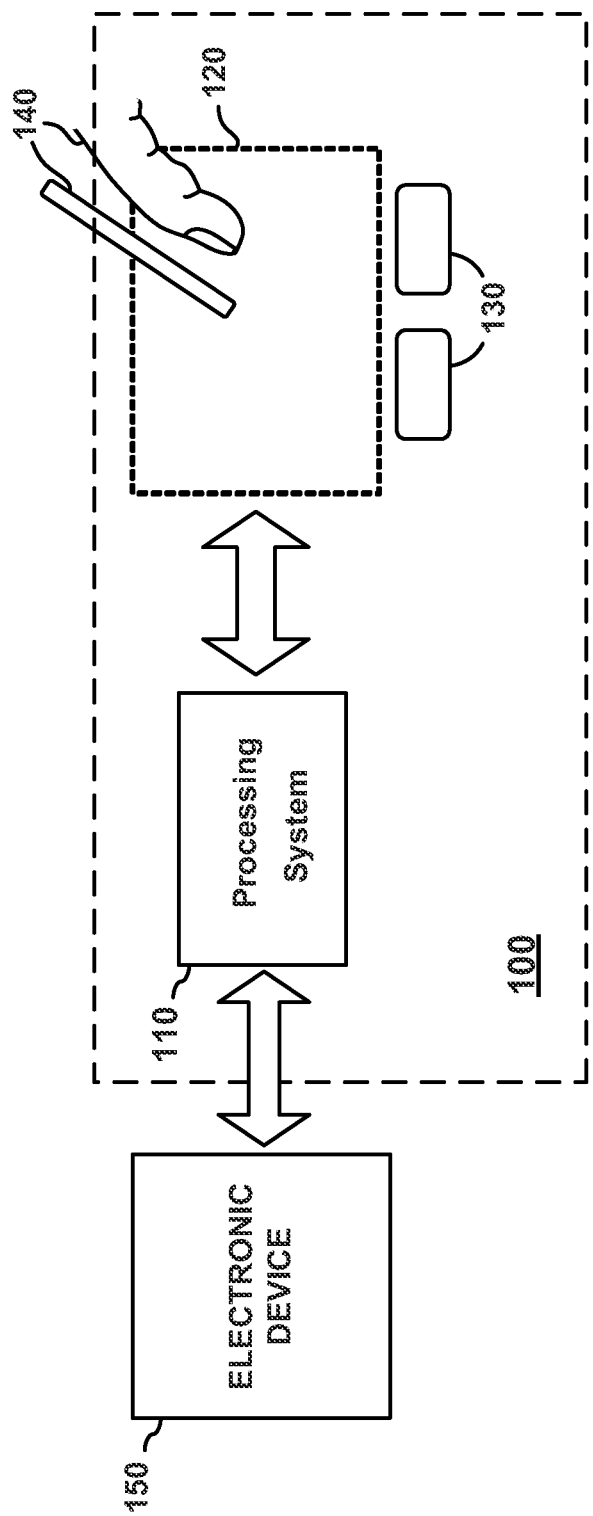
FIG. 1A is a block diagram of an example input device, in accordance with embodiments.

FIG. 1A is a block diagram of an example input device 100, in accordance with embodiments of the invention. The input device 100 may be configured to provide input to an electronic device 150. The input device 100 may be configured to provide input to an electronic system (not shown). As used in this document, the term "electronic system" or "electronic device") broadly refers to any system capable of electronically processing information. Some non-limiting, examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include I²C, SPI, PS/2, Universal Serial Bus (USB), Bluetooth, RF, and IRDA.

In FIG. 1A, input device 100 is shown as a proximity sensor device (also often referred to as a "touchpad" or a "touch sensor device") configured to sense input provided by one or more input objects 110 in a sensing region 120. Some example input objects include fingers and styli, as shown in FIG. 1A.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g., a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic acoustic, ultrasonic, and/or optical techniques.

Some implementations are configured to provide images that span one, two, three, or higher dimensional spaces. Some implementations are configured to provide projections of input along particular axes or planes.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals comprising response(s) corresponding to the transmitter signal(s). Sensor electrodes may be dedicated transmitters or receivers, or may be configured to both transmit and receive.

FIG. 1A, a processing system 110 is shown as part of the input device 100. The processing system 110 is configured to operate the hardware of the input device 100 to detect input in the sensing region 120. The processing system 11.0 comprises parts of or all of one or more integrated circuits (ICs) and/or other circuitry components. (For example, a processing system for a mutual capacitance sensor device may comprise transmitter circuitry configured to transmit signals with transmitter sensor electrodes, and/or receiver circuitry configured to receive signals with receiver sensor electrodes). In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g., to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1A shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the present invention are described in the context of a fully functioning apparatus, the mechanisms of the present invention are capable of being distributed as a program product (e.g., software) in variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 1B:
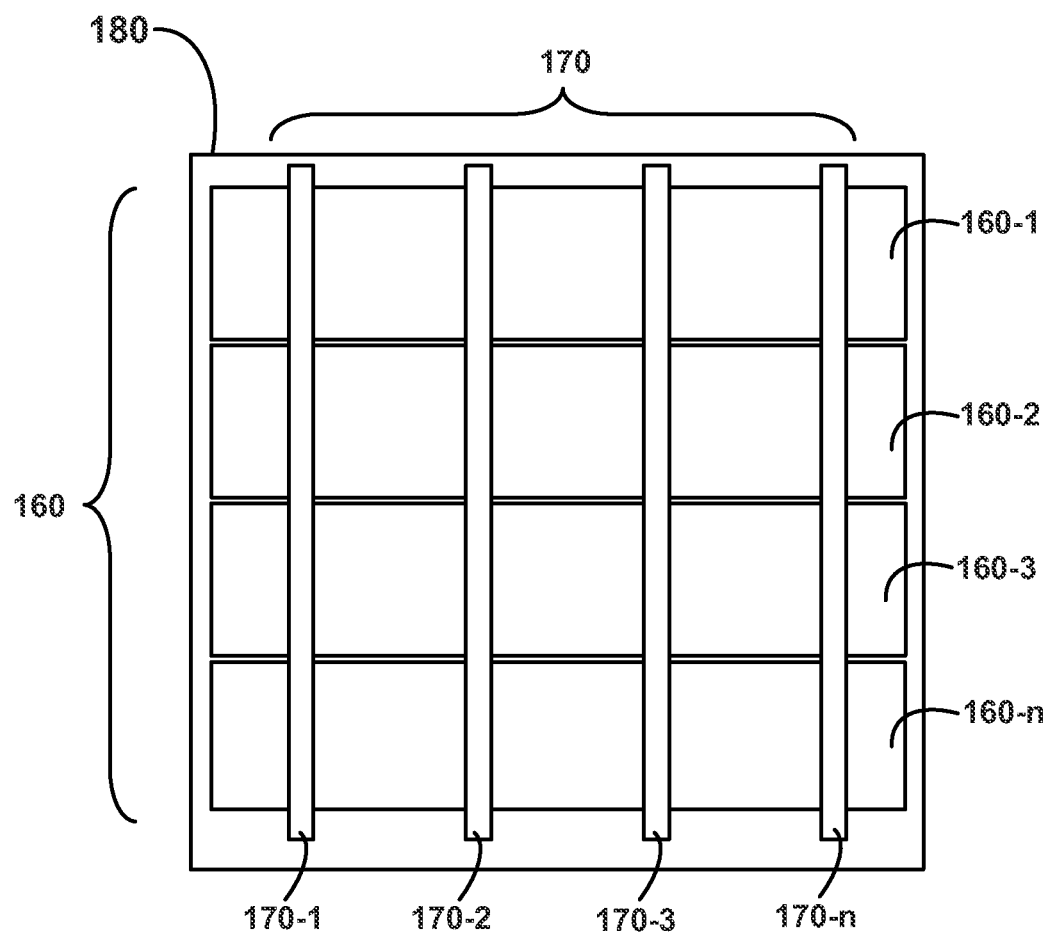
FIG. 1B shows a portion of an example sensor electrode pattern which may be utilized to generate all or part of the sensing region of an input device, according to an embodiment.

FIG. 1B shows a portion of an example sensor electrode pattern which may be disposed to generate all or part of the sensing region of an input device, according to an embodiment. For purposes of clarity of illustration and description, a simple rectangular pattern is illustrated, though it is appreciated that other patterns may be employed. The sensing pattern is made up of a plurality of receiver electrodes 170 (170-1, 170-2, 170-3, . . . 170-n) and a plurality of transmitter electrodes 160 (160-1, 160-2, 160-3, . . . 160-n) which overlay one another and are disposed on a substrate 180. In this example, touch sensing pixels are centered at locations where transmitter and receiver electrodes cross. It is appreciated that some form of insulating material is typically disposed between transmitter electrodes 160 and receiver electrodes 170. In one embodiment, transmitter electrodes 160 (160-1, 160-2, 160-3, . . . 160-n) and receiver electrodes 1.70 (170-1, 170-2, 170-3, . . . 170-n) may be disposed on a similar layer, where the transmitter electrode comprise a plurality of jumpers disposed on a second layer. In various embodiments, touch sensing includes sensing input objects anywhere in sensing region 120 and may comprise: no contact with any surfaces of the input device 100, contact with an input surface (e.g., a touch surface) of the input device 100, contact with an input surface of the input device 100 coupled with some amount of applied force or pressure, and/or a combination thereof.

Example Processing System

Figure 2:
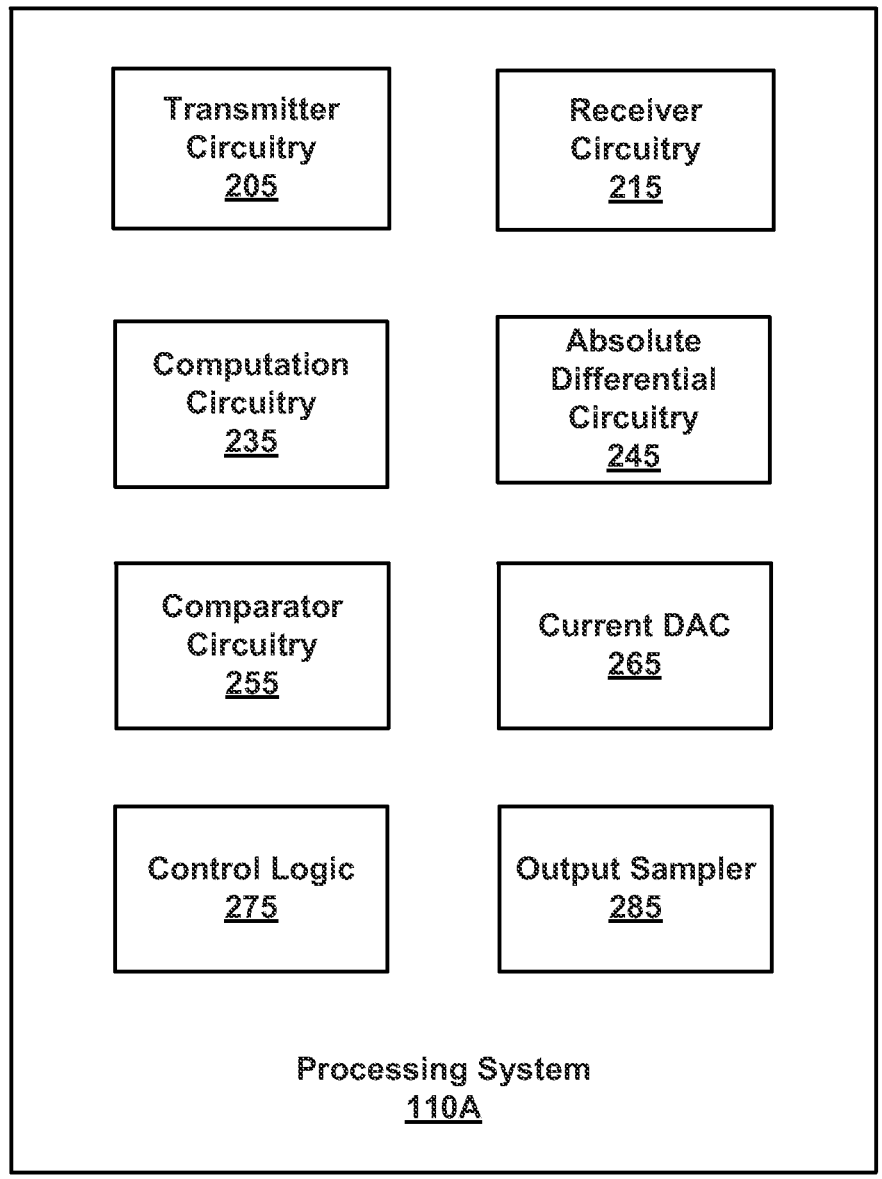
FIG. 2 illustrates some portions of an example processing system that may be utilized with an input device, according to various embodiments.

FIG. 2 illustrates an example processing system 110A which may be utilized with an input device (e.g., input device 100), according to various embodiments. Processing system 110A may be implemented with one or more ASICs, one or more ICs, one or more controllers, or some combination thereof in one embodiment, processing system 110A is communicatively coupled with a plurality of transmitter and a plurality of receiver electrodes that implement a sensing region 120 of an input device 100. In one embodiment, of input device 100, processing system 110A includes transmitter circuitry 205, receiver circuitry 215, computation circuitry 235, absolute differential circuitry 245, comparator circuitry 255, control logic 275, and output sampler 285. Some embodiments of processing system 110A may further include current DAC(s) 265. In some embodiments, processing system 110A and the input device 100, of which it is a part, may be disposed in or communicatively coupled with an electronic device 150, such as a display device, computer, or other electronic device.

Transmitter circuitry 205 operates to transmit transmitter signals on one or more transmitter electrodes 160. The signals that are transmitted on the transmitter electrodes each travel to a respective transmitter electrode by way of a transmitter path, two examples of which have been previously described in conjunction with FIGS. 1A and 1B. In a given time interval, transmitter circuitry 205 may transmit a transmitter signal (waveform) on one or more of a plurality of transmitter electrodes 160. Transmitter circuitry 205 may also be utilized to couple one or more transmitter electrodes 160 (and respective transmitter path(s)) of a plurality of transmitter electrodes 160 to high impedance, ground, or to a constant voltage when not transmitting a waveform on such transmitter electrodes. The transmitter signal may be a square wave, trapezoidal wave, or sonic other waveform.

Receiver circuitry 215 operates to receive resulting signals, via receiver electrodes. The received resulting signals correspond to and include some version of the transmitter signal(s) transmitted via the transmitter electrodes. These transmitted transmitter signals however, may be altered or changed in the resulting signal due to stray capacitance, noise, interference, and/or circuit imperfections among other factors, and thus may differ slightly or greatly from their transmitted versions. Resulting signals may be received on one or a plurality of receiver electrodes during a time interval. Receiver circuitry 215 includes a plurality of amplifiers, typically one per receiver electrode. Such amplifiers may be referred to herein as amplifiers, front-end amplifiers, integrating amplifiers, or the like, and receive a reference voltage at a first input and a resulting signal at a second input. The resulting signal is from a receiver electrode of a capacitive sensor device. One such amplifier of receiver circuitry 215 is described in greater detail in conjunction with description of FIG. 3 and FIG. 4.

Computation circuitry 235 operates to compute/determine a measurement of a change in a capacitive coupling between a transmitter electrode and a receiver electrode. Computation circuitry then uses this measurement to determine the position of an input object (if any) with respect to sensing region 120.

Absolute differential circuitry 245 takes outputs of an amplifier of receiver circuitry 215 and utilizes internal signals of the amplifier to generate and output a difference signal. The difference signal represents an absolute differential between currents utilized in the front-amplifier. The outputs utilized can include internal currents and voltages of the amplifier, to include the raw output of the amplifier.

Comparator circuitry 255 generates a non-linearity indication based on a comparison of the difference signal, from the absolute differential circuitry, with at least one reference signal. The reference signal(s), comprises a reference current or reference currents determined in advance to occur at different slew rates (levels of settling or saturation) of the amplifier. Through such comparison(s), comparator circuitry generates a non-linearity indication that can indicate whether the amplifier is operating linearly or non-linearly. In some embodiments, the non-linearity indication can characterize the amount of non-linearity (e.g., a representation of a spectrum from slightly non-linear to very non-linear). Comparator circuitry 255 may utilize a single comparator or multiple comparators in generation of the non-linearity indication. Saturated operation and unsettled operation are two forms of non-linear operation of an amplifier. This non-linearity indication can indicate whether or not the amplifier is saturated and if so characterize how saturated. The non-linearity indication can indicate whether or not the amplifier is settled, and if not, characterize the level of settling.

Current DAC (digital to analog convertor) 265, when included, comprises a plurality of reference currents which can be utilized and/or switched in as bits in order to make a series of comparisons (with one comparator) or a plurality of simultaneous comparisons (with a plurality of comparators) in order to convert the difference signal into non-linearity indication. These reference currents are predetermined and preset based upon empirical or modeled data with respect to a particular implementation of an amplifier. Current DAC 265 may not be utilized in an embodiment where comparator 255 is designed to only make a comparison to a single reference current.

Control logic 275 comprises decision making logic which selectively accepts or rejects an integrated resulting signal (a raw output of an amplifier) based upon an interpretation of a non-linearity indication. If accepted, such the raw output becomes an approved output and is utilized by other portions of processing system 110A (e.g., computation circuitry 235).

Based upon a non-linearity indication, in some embodiments, control logic communicates with receiver circuitry 215 to make a change in the operation of an amplifier that receives the resulting signal. Such changes can include one or more of changing an integration time of the amplifier, and changing a reset time associated with the amplifier. Such change(s) in the operation of the amplifier can be made to reduce or eliminate non-linear operation of the amplifier, and thus can compensate for a source of error (typically external interference) which causes the non-linear operation.

Based upon a non-linearity indication, in some embodiments, control logic communicates with transmitter circuitry 205 to make a change in the operation of a transmitter signal that is transmitted by the transmitter circuitry 205. Such changes can include one or more of changing a frequency of the transmitter signal, changing an amplitude of the transmitter signal, and a changing a phase of the transmitter signal. Such change(s) to the transmitter signal can be made to reduce or eliminate non-linear operation of the amplifier, and thus can compensate for a source of error (typically external interference) which causes the non-linear operation.

Output sampler 285 samples a raw output (integrated resulting signal) from an output of an amplifier of receiver circuitry 215. This sample is released as an approved output if control logic approves the output is either linear, or in some embodiments, sufficiently linear (not too non-linear) for use by other portions of processing system 110A (computation circuitry 235). For example, in an embodiment where only coarse touch sensing is being performed, a small amount of non-linearity may not matter to a result.

Example Non-linearity Determination Architecture

Figure 3:
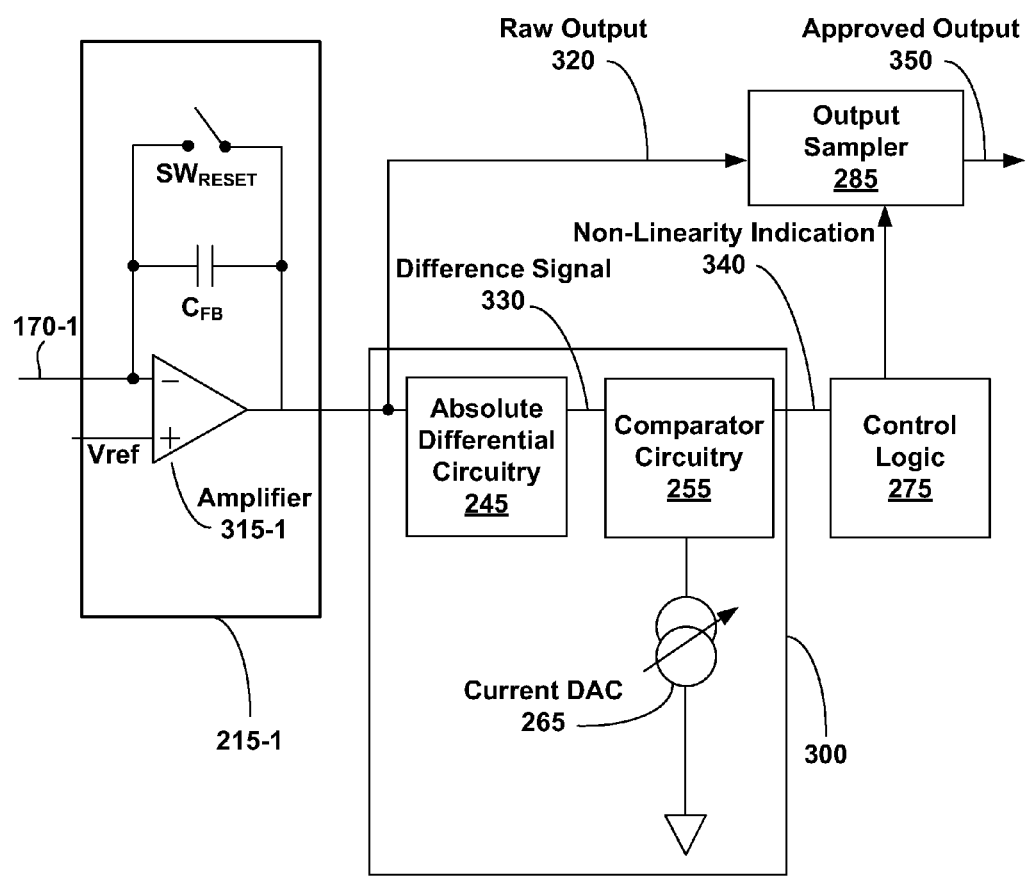
FIG. 3 illustrates a block diagram of example non-linearity determination architecture of a processing system that may be utilized with an input device, according to various embodiments.

FIG. 3 illustrates a block diagram of example non-linearity determination architecture 300 of a processing system 110A that may be utilized with an input device, according to various embodiments. Non-linearity determination architecture 300, may be used to detect external interferences at front-end amplifier 315-1, which cause non-linear operation of amplifier 315-1. Non-linearity determination architecture 315-1 utilizes a current DAC (digital to analog convertor), in one embodiment, to set a threshold that would determine the acceptable slewing (which reflects an acceptable settling and/or level of saturated operation) of amplifier 315-1. Amplifier 315-1 has a reset state and an integrate state. Slew may be measured during an integration state, at the end of an integration state, during reset a reset state, or at the end of a reset state. The output of non-linearity determination architecture 300 may then be used to determine whether or not to accept a sampled output from front-end amplifier 315-1. This allows for the detection of non-linearity at front-end amplifier 315-1 due to back-coupled and/or finger-coupled interferences at the cost of very few transistors and low current consumption. This also allows processing system 110A (in particular control logic 275) to take actions to reduce or eliminate the effects of the interference and thus reduce or eliminate the non-linear operation of amplifier 315-1.

As illustrated in FIG. 3, an amplifier 315-1 of receiver circuit 215-1 receives an input signal from a receiver electrode 170-1 on an inverting input and a reference voltage, Vref, on a non-inverting input. Amplifier 315-1 includes a feedback capacitor, $C_{FB}$, coupled between its output and its inverting input. A selectable reset switch, $SW_{RESET}$, is coupled in parallel with $C_{FB}$. Processing system 1104 can selectively close $SW_{RESET}$ in order to reset amplifier 315-1. The raw output 320, of amplifier 315-1, is a resulting signal that has been integrated from receiver electrode 170-1. Raw output 320 is coupled as an input to absolute differential circuitry 245 and is also sampled by output sampler 285.

Absolute differential circuitry 245, comparator 255, and current DAC 265 (when included) form a non-linearity determining architecture 300 which may be a single circuit to which the raw outputs 320 of a plurality of receiver circuits 215 may be multiplexed as inputs, or which may constitute a representative architecture, a copy of which is replicated and coupled to each of a plurality of receiver circuits of an input device.

Absolute differential circuitry 245 utilizes raw output and other internal current and voltage signals of amplifier 315-1 to generate a difference signal 330. Difference signal 330 represents an absolute differential between currents utilized in amplifier 315-1. This difference signal (also referred to as "i_abs") will be zero or very near zero when amplifier 315-1 is operating in a linear fashion and will increase in value toward some maximum value as amplifier 315-1 operates more non-linearly. Comparator 255 receives difference signal 330 and compares it to one or more reference currents (multiple reference currents may be provided by current DAC(s) 265). A single reference current may be used for comparison to make a linear/non-linear determination, while a number of reference currents may be utilized to determine by linear/non-linear operation and farther, to characterize a level of non-linearity. Comparator circuitry 255 outputs a non-linearity indication (e.g., linear, non-linear, characterization of non-linearity) which control logic 275 uses to determine whether to approve a raw output 320 that has been sampled by output sampler 285. If approved, output sampler 285 provides the sampled raw output 320 as an approved output 350.

Example Absolute Differential Circuitry

Figure 4:
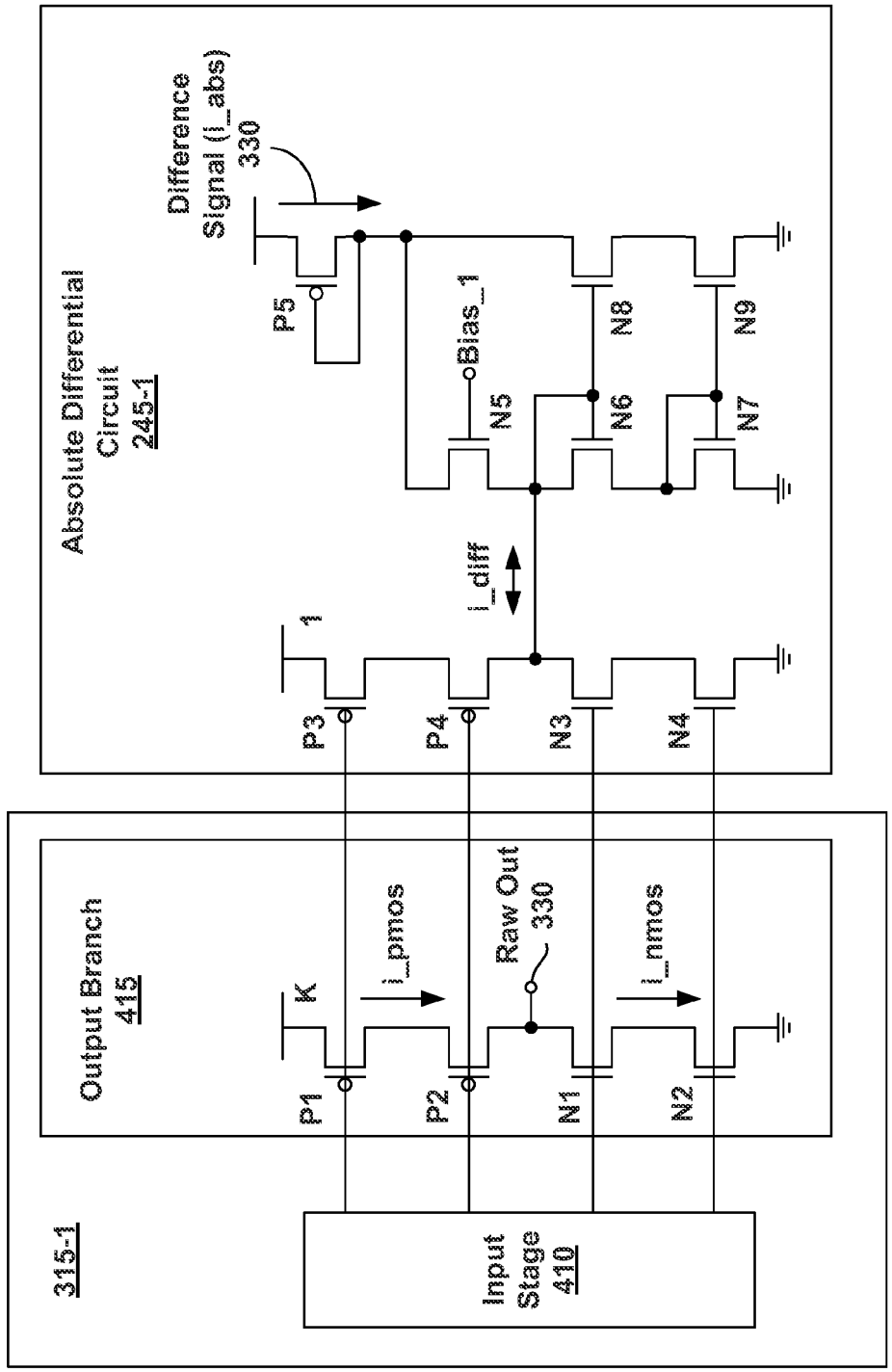
FIG. 4 illustrates example absolute differential circuitry, in accordance with an embodiment.

FIG. 4 illustrates example absolute differential circuit 245-1, in accordance with an embodiment. In FIG. 1, input stage 110 represents the input stage of a receiver circuit within amplifier 315-1. Transistors P1, P2, N1, and N2 are in the output branch 415 of amplifier 315-1. The upper portion, P1 and P2, of output branch 115 has a current i_pmos flowing through it. The lower portion, N1 and N2, of output branch 415 a current i_nmos flowing through it. Raw output 320 is the output of amplifier 315-1, and is what is sampled by output sampler 285.

Absolute differential circuit 245-1 detects whether the output of amplifier 315-1 is settled or unsettled and/or saturated or unsaturated. Transistors P3, P4, N3, and N4 mirror currents from output branch 415 to absolute differential circuit 245-1 and the difference in current between P3 and P4 as compared to transistors N3 and N4 is a current i_diff.

Current mirrors in absolute differential circuit 245-1 copy and subtract a fraction (1:K) of these currents to generate a bi-directional current difference signal (i_diff). The couplings from the gate of P1 to P3 and from the gate of P2 to the gate of P4 mirrors the fractional value of the i_pmos current, while the couplings from the gate of N1 to the gate of N3 and from the gate of N2 to the gate of N4 mirror the 1/K fractional value of the i_nmos current of the front end integrating amplifier into the absolute differential circuitry.

The generated i_diff is utilized by transistors P5 and N5-N9 of absolute differential circuit 245-1 to generate an absolute value, difference signal (i_abs) 330, of the i_diff current. Transistor N5 is biased by a bias voltage, Bias_1. During the settling of output 320, the currents i_pmos and i_nmos may vary quite a bit. However, when the output is settled, i_pmos and i_nmos become the same, and that results in an i_diff signal of about 0. When i_diff is about zero, there is only a small specific, predefined, minimum amount of difference signal (i_abs) 330 flowing through absolute differential circuit 245-1. When the i_pmos current is larger than the i_nmos current, transistors N6 and N7 sink the extra current. This current is copied by transistors N8 and N9 and results in the. i_abs current flowing through transistor N9. When i_nmos is greater than i_pmos, transistor P5 sources that current to transistors N3 and N4.

Based on the amount of settling, there could be a slight difference between i_pmos and i_nmos, where either one can he greater than the other. Based on which of i_pmos or i_nmos is greater, there may be more current flowing in either P3 and P4 or else in N3 and N4. The difference of those two is i_diff. This i_diff is then the current that flows through P5 as i_abs. Circuit 245-1 converts this i_diff to an absolute value in the form of difference signal 330. If the i_diff is very small, then the mirror from N6 and N7 over to N8 and N9 will have almost no current flowing through it. That will force the current through 95 to be almost zero (or what ever has been set as a minimum for difference signal 330). When i_diff is not small, the same mirrors from N6 and N7 over to N8 and N9 will induce current through N8 and N9 and thus force 95 to provide more current. This results in more i_abs signal. The resulting absolute current i_abs is then mirrored to comparator circuitry 255 that generates a digital output representing amplifier slew. This digital output is shown as non-linearity indication 340, in FIGS. 4, 5A, and 5B. The acceptable level of settling may be determined by setting the appropriate comparison threshold using a current DAC, such as current DAC 265.

In cases where the output of amplifier 315-1 saturates (to ground or to supply voltage), absolute differential circuit 245-1 is also used to detect this non-linearity. For example, the output goes to the rail (node "raw out" 330 is almost VDD or GND); the corresponding output branch 415 transistor enters the triode region. Transistors P3 and P4, on the other hand, are still in saturation allowing for a larger current to flow through them. This difference in the operation regime of the transistors generates the i_diff signal. This i_diff signal is utilized by transistors P5 and N5-N9 to generate the difference signal (i_abs) 330, which is then mirrored out or otherwise provided to comparator circuitry 255 for generation of the slew signal, which constitutes non-linearity indication 340.

In a saturated condition of amplifier 315-1, output 320 is either all the way to ground or all the way to the supply rail. In one condition, when saturation is all the way to ground, transistors N1 and N2 are almost off; however, their bias voltages are fed to the absolute current circuit to the gates of transistors P3 and N4. At the same time, because the output is at a particular rail, it is almost as good as settled, therefore the current to i_pmos is very small, almost none. What then exists is a situation where the voltage signals being propagated to transistors N3 and N4 and a current propagated to transistors P3 and P4. This causes a situation where i_diff has very little current from the transistors P3 and P4 branch, but a lot of current from the transistors N3 and N4 branch. As a result, transistor P5 needs to provide the extra current that transistors N3 and N4 are requiring. This causes i_abs to become big, and this high i_abs is then mirrored out to current comparator 255.

In another situation where output 320 is saturated to the supply voltage, transistors P1 and P2 propagate a voltage to transistors P3 and P4, while transistors N1 and N2 propagate a current to transistors N3 and N4. A similar situation occurs where there is very little current in transistors N3 and N4, but very high current in transistors P3 and P4. This results in a positive which is very high and needs to be sunk by N6 and N7. Therefore the i_abs signal also becomes high, indicating a saturated condition.

Example Comparator Circuitry

Figure 5A:
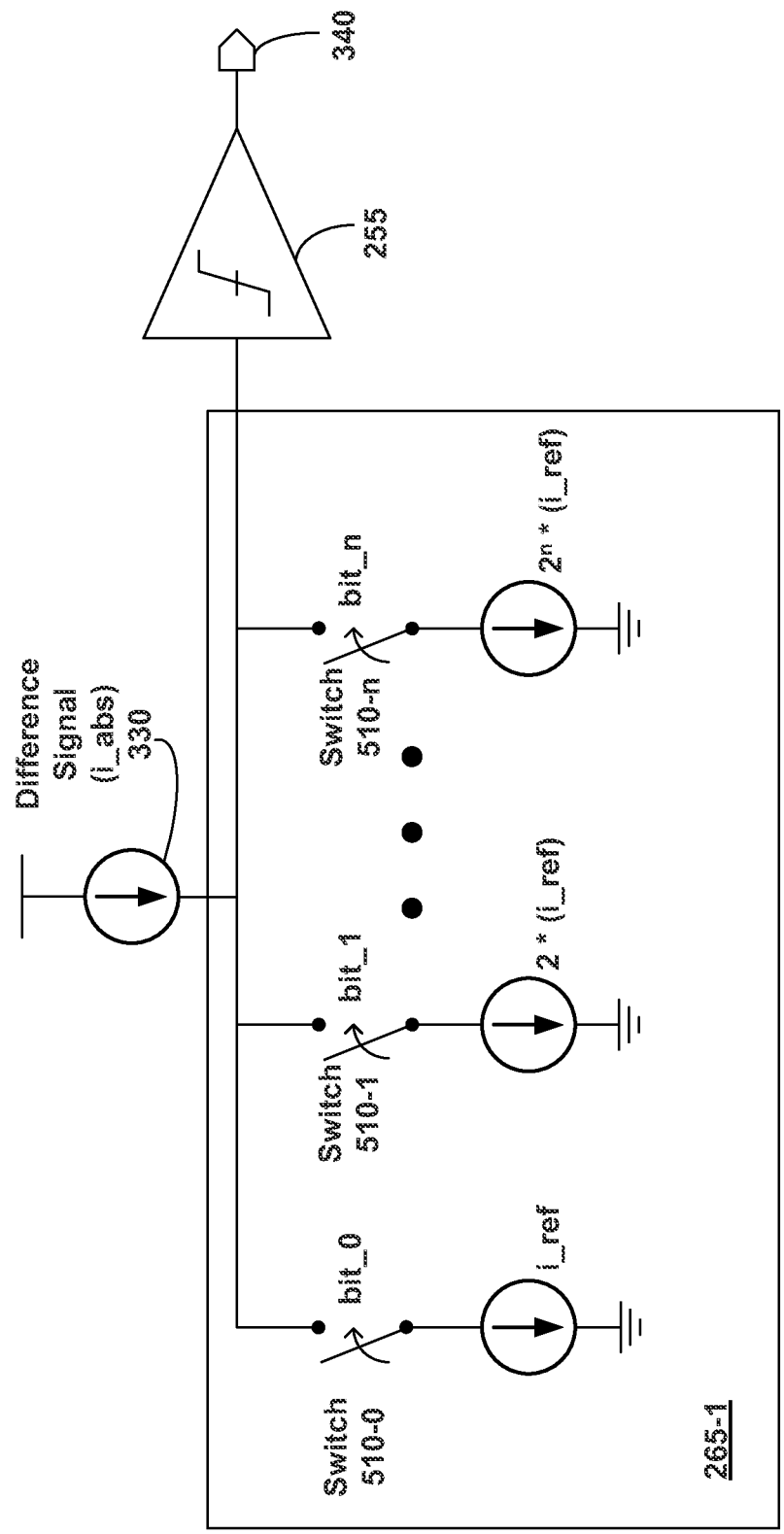
FIGS. 5A and 5B illustrate two examples of current comparator circuitry, in accordance with embodiments.
Figure 5B:
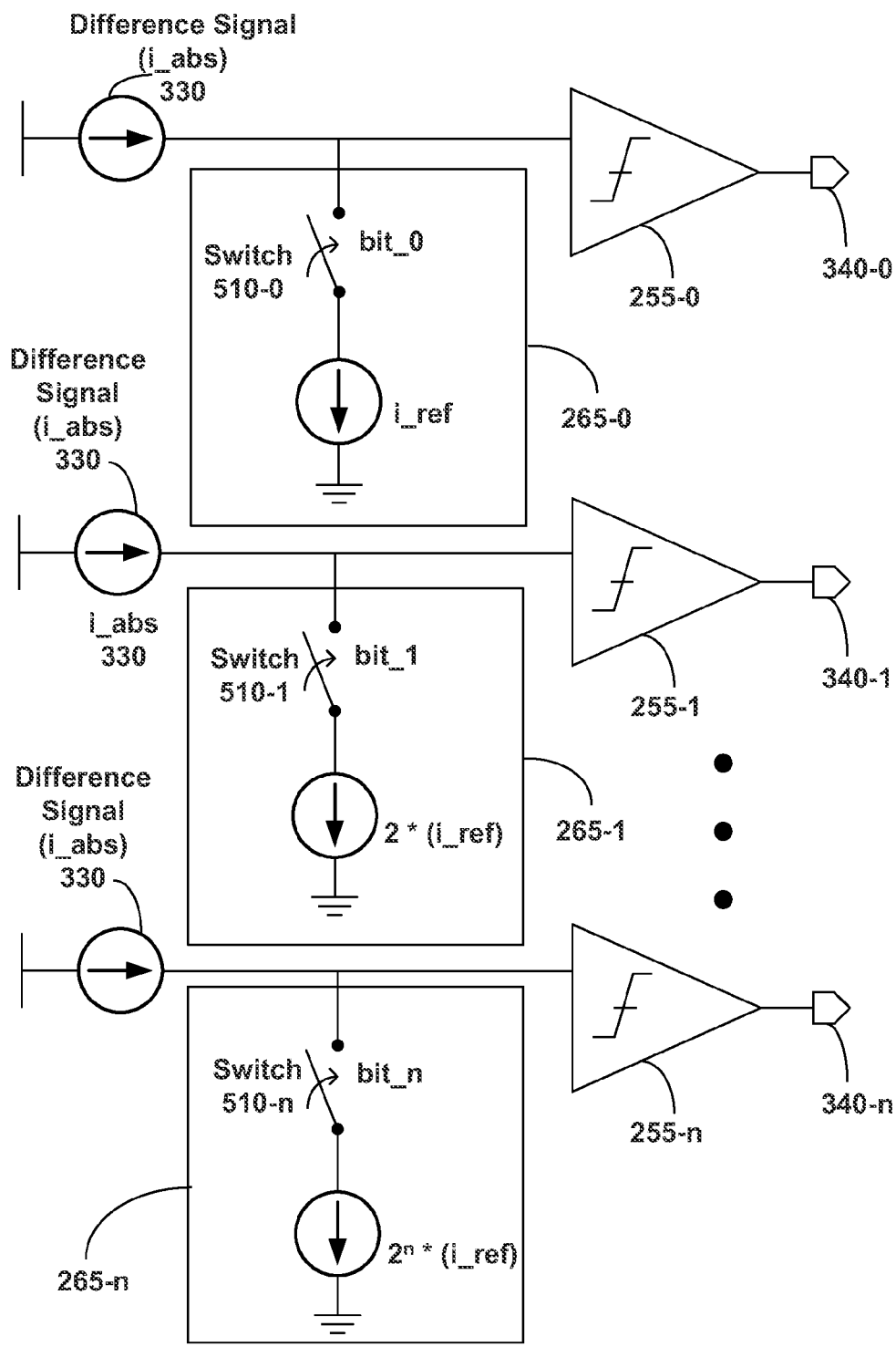

FIGS. 5A and 5B illustrate two examples of current comparator circuitry (255-0 in FIG. 5A and 255-0, 255-1 . . . 255-n in FIG. 5B), in accordance with embodiments. In FIG. 5A, i_abs is mirrored from P5 over as an input to the current comparator circuit 255 and as input to one or more bits of a single current DAC, DAC 265-1. FIG. 5A represents a time-multiplexed manner of performing a comparison, as during a particular time period. There are multiple reference currents (i_ref, 2n(i_ref), 2n(i_ref)) which can be switched in for comparison to i_abs (difference signal 330). For example, processing system 110A can switch on one or more of switches 510-0, 510-1, to 510-n to determine the value of the reference current that is utilized for comparison. In different periods of time, different reference currents may be compared. Switches 510 can be switched in during different periods of time to represent bits 0, 1 . . . n (shown as "bit_0", "bit_1", and "bit_n") of an overall non-linearity indication 340.

FIG. 5B illustrates an array of comparator circuits 255-0, 255-1 . . . 255-n that which can be utilized to simultaneously compare i_abs (difference signal 330) as provided by a plurality of current DACs, 265-0, 265-1, . . . 265-n. The comparisons can be performed in a single or multiple time periods. Outputs 340-0, 340-1 . . . 340-n, in one embodiment represent bits 0, 1 . . . n (shown as "bit_0", "bit_1", and "bit_n") of an overall non-linearity indication 340. The trade off between the circuits illustrated in FIGS. 5A and 5B is that more real estate (in terms of space and transistors used) is required by the circuitry of FIG. 5B in order to act a quicker result than can be achieved by the circuit of FIG. 5A.

Example Method of Interference Determination in a Capacitive Sensor Device

Figure 6B:
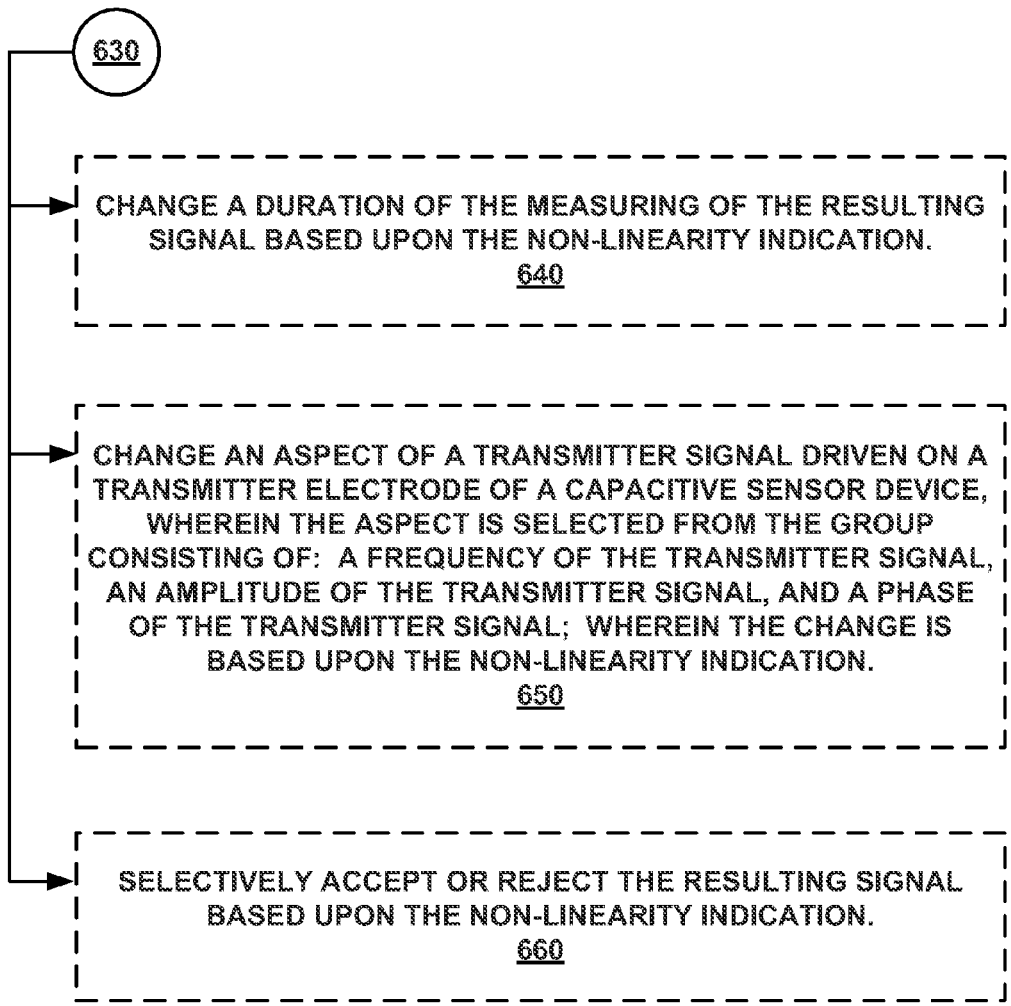

FIGS. 6A and 6B illustrate a flow diagram of an example method of interference determination in a capacitive sensor device, in accordance with embodiments. For purposes of illustration, during the description of flow diagram 600, reference will be made to components of processing system 110A of FIG. 2, and to circuitry of FIG. 3 and FIG. 4, and FIGS. 5A and 5B. In some embodiments, not all of the procedures described in flow diagram 600 are implemented. In some embodiments, other procedures in addition to those described may be implemented. In some embodiments, procedures described in flow diagram 600 may be implemented in a different order than illustrated and/or described.

At 610 of flow diagram 600, in one embodiment, a resulting signal received from a receiver electrode of a capacitive sensor device is measured. An amplifier performs the measuring. With reference to FIGS. 2 and 3, in one embodiment, amplifier 315-1 of receiver circuit 215-1 measures a resulting signal from receiver electrode 170-1.

At 620 of flow diagram 600, in one embodiment, a difference signal is determined. The difference signal, (e.g., difference signal 330) represents an absolute differential between currents utilized in the amplifier during the measuring. For example, difference signal 330 represents a difference in currents that exist within portions of an output branch of amplifier 315-1.

At 630 of flow diagram 600, in one embodiment, a non-linearity indication is generated based upon a comparison of the difference signal with at least one reference signal. For example, as illustrated in FIGS. 3, 4, and 5A and 5B, non-linearity indication 340 is generated by comparison of difference signal 330 to one or more reference currents. Non-linearity indication 340 can indicate whether an amplifier, such as amplifier 315-1 is operating in a linear or non-linear state. When an amplifier is operating in a non-linear state (somewhat saturated or else not settled), the extent of the non-linearity can be characterized by non-linearity indication 340. That is, non-linearity indication 340 can characterize the extent of the saturation and/or the extent of settling of an amplifier. For example, when several reference currents are used for comparison to difference signal, non-linearity indication 340 may be expressed as a range of bits, where a value of zero may represent linear operation and values higher than zero (up to the maximum value possible to express with the number of bits of resolution) indicate a more unsettled or more saturated condition of operation of an amplifier.

At 640 of flow diagram 600, in one embodiment, the method farther includes changing a duration of the measuring of the resulting signal based upon the non-linearity indication. For example, control logic 275 may alter this parameter in response non-linearity indication 340 indicating that an amplifier is not operating linearly. This is one way to overcome external interference that may be causing the non-linear operation.

At 650 of flow diagram 600, in one embodiment, the method as described in 610 through 630 further includes changing an aspect of a transmitter signal driven on a transmitter electrode of the capacitive sensor device. The aspect being changed may be one or more of: a frequency of a transmitter signal that is transmitted on a transmitter electrode, an amplitude of transmitter signal, and/or a phase of the transmitter signal. For example, control logic 275 may alter one or more of these aspects in response to non-linearity indication 340 indicating that an amplifier is not operating linearly. This is one way to overcome external interference that may be causing the non-linear operation.

At 660 of flow diagram 600, in one embodiment, the method as described in 610 through 630 further includes selectively accepting or rejecting the resulting signal based upon the non-linearity indication. For example, in response to control logic 275 determining from non-linearity indication 340 that an amplifier is operating in a linear fashion, output sampler 285 may be instructed to permit a raw output 320, which has been sampled, to be forwarded as an approved output 350. Similarly, based on the type of touch sensing being performed, completely linear operation of an amplifier may not be a requisite. Thus, in such situations, in response to control logic 275 determining from non-linearity indication 340 that an amplifier is operating below a predetermined threshold of non-linearity, output sampler 285 may be instructed to permit a raw output 320, which has been sampled, to be forwarded as an approved output 350.

Thus, the embodiments and examples set forth herein were presented in order to best explain various selected, embodiments of the present invention and its particular application and to thereby enable those skilled in the art to make and use embodiments of the invention. However, those skilled in the art will recognize that the foregoing description and examples have been presented for the purposes of illustration and example only. The description as set forth is not intended to be exhaustive or to limit the embodiments of the invention to the precise form disclosed.

What is claimed is:

1. An interference determining (ID) circuit for a capacitive sensor device, said ID circuit comprising:
   a receiver circuit comprising:
      a feedback capacitor; and
      an amplifier external to the feedback capacitor and comprising:
         a first input for receiving a reference voltage;
         a second input associated with a resulting signal from a sensor electrode of said capacitive sensor device; and
         a first set of transistors comprising gates and a plurality of currents flowing through the first set of transistors,
      wherein said receiver circuit is configured to output an integrated version of said resulting signal using the feedback capacitor and the first set of transistors;
   an absolute differential circuit separate from said amplifier and comprising:
      a second set of transistors that mirror the plurality of currents, wherein the gates of the first set of transistors are coupled to the gates of the second set of transistors; and
      a third set of transistors comprising a current mirror and configured for outputting a single difference signal, wherein said single difference signal represents an absolute differential between the plurality of currents; and
   a comparator circuit coupled with said absolute differential circuit and configured for receiving said single difference signal from said absolute differential circuit and generating a non-linearity indication based on a comparison of said single difference signal with at least one reference signal,
   wherein the non-linearity indication corresponds to the amplifier.

2. The ID circuit of claim 1, further comprising:
   control logic coupled with said comparator circuit and configured to selectively accept or reject said integrated version of said resulting signal based upon said non-linearity indication.

3. The ID circuit of claim 1, further comprising:
   control logic coupled with said comparator circuit and configured to make a change based upon said non-linearity indication, wherein said change is selected from the group consisting of: changing an integration time of said receiver circuit, and changing a reset time associated with said amplifier.

4. The ID circuit of claim 1, further comprising:
   control logic coupled with said comparator circuit and configured to make a change to a transmitter signal of said capacitive sensor device based upon said non-linearity indication, wherein said change is selected from the group consisting of: a change to a frequency of said transmitter signal, a change to an amplitude of said transmitter signal, and a change to a phase of said transmitter signal.

5. The ID circuit of claim 1, wherein said comparator circuit comprises a plurality of comparators, wherein each of said comparators is configured for generating said non-linearity indication based on a comparison made to said single difference signal.

6. The ID circuit of claim 1, wherein said comparator circuit is further configured for generating said non-linearity indication based on comparison of said single difference signal with a plurality of reference signals.

7. The ID circuit of claim 1, wherein said non-linearity indication characterizes saturation of said amplifier.

8. The ID circuit of claim 1, wherein said non-linearity indication characterizes settling of said amplifier.

9. A method of interference determination in a capacitive sensor device, said method comprising:
   receiving, by a receiver circuit comprising a feedback capacitor and an amplifier, a resulting signal from a sensor electrode of said capacitive sensor device,
   wherein said amplifier comprises a first set of transistors comprising gates and a plurality of currents flowing through the first set of transistors;
   outputting, using the feedback capacitor and the first set of transistors, an integrated version of said resulting signal;
   generating, by an absolute differential circuit comprising a second set of transistors that mirror the plurality of currents and a third set of transistors comprising a current mirror, a single difference signal representing an absolute differential between the plurality of currents, wherein the gates of the first set of transistors are coupled to the gates of the second set of transistors; and
   generating a non-linearity indication, by a comparator circuit, based upon a comparison of said single difference signal, received from said absolute differential circuit, with at least one reference signal, wherein the non-linearity indication corresponds to the amplifier.

10. The method of claim 9, further comprising:
    changing a duration of said measuring of said resulting signal based upon said non-linearity indication.

11. The method of claim 9, further comprising:
    changing an aspect of a transmitter signal driven on a transmitter electrode of said capacitive sensor device, wherein said aspect is selected from the group consisting of: a frequency of said transmitter signal, an amplitude of said transmitter signal, and a phase of said transmitter signal; and wherein said changing is based upon said non-linearity indication.

12. The method of claim 9, further comprising:
selectively accepting or rejecting said integrated version of said resulting signal based upon said non-linearity indication.

13. The method of claim 9, wherein said generating a non-linearity indication based upon a comparison of said single difference signal with at least one reference signal further comprises:
generating said non-linearity indication based on a comparison of said single difference signal with a plurality of reference signals.

14. The method of claim 9, wherein said generating a non-linearity indication based upon a comparison of said single difference signal with at least one reference signal comprises:
generating said non-linearity indication to characterize saturation of said amplifier.

15. The method of claim 9, wherein said generating a non-linearity indication based upon a comparison of said single difference signal with at least one reference signal comprises:
generating said non-linearity indication to characterize settling of said amplifier.

16. An input device comprising:
a sensor pattern including a transmitter electrode and a receiver electrode; and
a processing system coupled with said sensor pattern and configured to:
drive a transmitter signal onto said transmitter electrode;
receive, by a receiver circuit comprising a feedback capacitor and an amplifier, a resulting signal from said receiver electrode, wherein said amplifier comprises a first set of transistors comprising gates and a plurality of currents flowing through the first set of transistors;
output, using the feedback capacitor and the first set of transistors, an integrated version of said resulting signal;
generate, by an absolute differential circuit comprising a second set of transistors that mirror the plurality of currents and a third set of transistors, a single difference signal representing an absolute differential between the plurality of currents, wherein the gates of the first set of transistors are coupled to the gates of the second set of transistors;
generate a non-linearity indication, by a comparator circuit, based on a comparison of said single difference signal, received from said absolute differential circuit, with at least one reference signal, wherein the non-linearity indication corresponds to the amplifier; and
take one of a plurality of actions based on said non-linearity indication.

17. The input device of claim 16, wherein said processing system is further configured to:
generate said non-linearity indication based on a comparison of said single difference signal with a plurality of reference signals.

18. The input device of claim 16, wherein said processing system being configured to take one of a plurality of actions based on said non-linearity indication, comprises said processing system being configured to:
change a frequency of sampling said resulting signal with said amplifier.

19. The input device of claim 16, wherein said processing system being configured to take one of a plurality of actions based on said non-linearity indication, comprises said processing system being configured to:
change an aspect of said transmitter signal.

20. The input device of claim 16, wherein said processing system being configured to take one of a plurality of actions based on said non-linearity indication, comprises said processing system being configured to:
selectively accept and reject said integrated version of said resulting signal based upon said non-linearity indication.

\* \* \* \* \*